United States Patent
Chang

(10) Patent No.: US 8,053,750 B2
(45) Date of Patent: Nov. 8, 2011

(54) PHASE CHANGE MEMORY DEVICE HAVING HEAT SINKS FORMED UNDER HEATERS AND METHOD FOR MANUFACTURING THE SAME

(75) Inventor: Heon Yong Chang, Suwon-si (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 181 days.

(21) Appl. No.: 12/431,922

(22) Filed: Apr. 29, 2009

(65) Prior Publication Data
US 2010/0059732 A1  Mar. 11, 2010

(30) Foreign Application Priority Data
Sep. 5, 2008  (KR) .................... 10-2008-0087934

(51) Int. Cl.
*H01L 29/02* (2006.01)
(52) U.S. Cl. .. 257/2; 257/3; 257/4; 257/5; 257/E29.002; 438/102; 438/103; 365/163
(58) Field of Classification Search ................ 257/2–5, 257/E29.002; 438/102–103; 365/163
See application file for complete search history.

(56) References Cited

U.S. PATENT DOCUMENTS

| | | | |
|---|---|---|---|
| 7,667,219 B2 * | 2/2010 | Chang et al. | 257/4 |
| 2003/0183881 A1* | 10/2003 | Lee et al. | 257/382 |
| 2007/0120106 A1* | 5/2007 | Hayakawa et al. | 257/3 |
| 2007/0120107 A1* | 5/2007 | Hayakawa | 257/4 |

FOREIGN PATENT DOCUMENTS

| | | |
|---|---|---|
| JP | 2007-149900 A | 6/2007 |
| JP | 2007-227812 A | 9/2007 |
| KR | 1020080022450 A | 3/2008 |
| KR | 1020080039701 A | 5/2008 |

* cited by examiner

*Primary Examiner* — Bradley K Smith
*Assistant Examiner* — Jami M Valentine
(74) *Attorney, Agent, or Firm* — Ladas & Parry LLP

(57) ABSTRACT

A phase change memory device includes a silicon substrate having a cell region and a peripheral region. A first insulation layer is formed in the cell region and includes a plurality of holes. Cell switching elements are formed in the holes of the first insulation layer and heat sinks are formed on the cell switching elements. The heaters are formed on the center of the heat sinks and spacers are formed on the sidewalls. A gate is formed in the peripheral region of the silicon substrate formed of a gate insulation layer, a first conductive layer, a second conductive layer, and a hard mask layer. A second insulation layer covers the entire surface of the resultant silicon substrate and exposes the spacers and the heaters and the hard mask layer. Finally, a stack pattern of a phase change layer and a top electrode is formed on the heaters.

16 Claims, 8 Drawing Sheets

US 8,053,750 B2

PHASE CHANGE MEMORY DEVICE HAVING HEAT SINKS FORMED UNDER HEATERS AND METHOD FOR MANUFACTURING THE SAME

CROSS-REFERENCE TO RELATED APPLICATIONS

The present application claims priority to Korean patent application number 10-2008-0087934 filed on Sep. 5, 2008, which is incorporated herein by reference in its entirety.

BACKGROUND OF THE INVENTION

The present invention relates to a phase change memory device and a method for manufacturing the same, and more particularly, to a phase change memory device in which heaters are formed in a self-aligned manner so that the interfaces between the heaters and a phase change layer can be uniformly formed and heat sinks are formed under the heaters so that the amorphous phase of the phase change layer can be stably formed and a method for manufacturing the same.

Generally, memory devices are divided into two categories, i.e., a volatile RAM (random access memory) that loses inputted information when power is interrupted and a non-volatile ROM (read-only memory) that can maintain the stored state of inputted information even when power is interrupted. Examples of the volatile RAM may include a DRAM (dynamic RAM) and an SRAM (static RAM), and an example of the non-volatile ROM may include a flash memory device such as an EEPROM (electrically erasable and programmable ROM) can be mentioned.

Although DRAM is an excellent memory device, the DRAM requires a high charge storing capacity. Therefore, it is difficult to accomplish a high level of DRAM integration since the surface area of an electrode must be increased. Further, in the flash memory device, a high operation voltage is required when compared to a power supply voltage due to the fact that two gates are stacked on each other. Therefore, it is difficult to accomplish a high level of flash memory integration since a separate booster circuit is needed to generate a voltage necessary for write and delete operations.

As a result, research has been actively made to develop a novel memory device having a simple configuration and capable of accomplishing a high level of integration while retaining the characteristics of a non-volatile memory device. For example, a phase change memory device has been disclosed in the art. In the phase change memory device, a phase change occurs in a phase change layer interposed between a bottom electrode and a top electrode from a crystalline state to an amorphous state due to current flow between the bottom electrode and the top electrode. The information stored in a cell of the phase change memory is recognized by the medium of a difference in resistance between the crystalline state and the amorphous state.

One of the most important factors that must be considered in developing a phase change memory device is to reduce programming current. Accordingly, recent phase change memory devices adopt vertical PN diodes as cell switching elements in place of NMOS transistors.

While not shown in a drawing, a phase change memory device employing the vertical PN diodes as cell switching elements includes heaters formed so as to decrease the contact area between the heaters and the phase change layer so that current flow from the cell switching elements can be transmitted to the phase change layer through the heaters.

However, it is difficult to uniformly form the heaters and limitations exist in decreasing the size of the heaters. Therefore, an approach is needed for overcoming these difficulties and limitations.

In addition, when reset programming is implemented in the phase change memory device, i.e., when the phase change layer is quenched after being melted, it is necessary to quickly decrease the temperature of the heaters, because heat transfer occurs to the heaters, so that the phase change layer can stably form an amorphous phase and a reset state with high resistance can be produced.

Although most heat is transferred to the heaters after the phase change layer is melted, nucleation occurs in the melted phase change layer when the phase change layer is not quickly cooled. As a result, a problem is caused in that the nucleation causes a decrease in the reset resistance of the amorphous state. Thus, as the reset resistance of the amorphous phase is decreased, the difference between the reset resistance of the amorphous state and the set resistance of the crystalline state is diminished. Accordingly, the sensing margin of the phase change memory device can be adversely decreased.

In particular, the phase change memory device performs a sensing operation using the difference between the reset resistance of the amorphous state and the set resistance of the crystalline state. Therefore, if the reset resistance is decreased, the sensing margin is correspondingly decreased, whereby the durability of the phase change memory device can deteriorate.

SUMMARY OF THE INVENTION

Embodiments of the present invention are directed to a phase change memory device in which heaters are formed in a self-aligned manner so that the interfaces between the heaters and a phase change layer can be uniformly formed and a method for manufacturing the same.

Embodiments of the present invention are also directed to a phase change memory device in which heat sinks are formed under the heaters so that the amorphous phase of the phase change layer can be stably formed and a method for manufacturing the same.

In one embodiment of the present invention, a phase change memory device comprises a silicon substrate having a cell region and a peripheral region; a first insulation layer formed in the cell region of the silicon substrate and having a plurality of holes; cell switching elements formed in the holes; heat sinks formed on the cell switching elements; heaters formed on center portions of the heat sinks; spacers formed on the heat sinks to surround the heaters; a gate formed in the peripheral region of the silicon substrate and having a stack structure of a gate insulation layer, a first conductive layer, a second conductive layer, and a hard mask layer; a second insulation layer formed on an overall surface of the silicon substrate which is formed with the spacers, the heaters, the heat sinks and the gate, to expose the spacers and the heaters of the cell region and the hard mask layer of the peripheral region; and stack patterns of a phase change layer and a top electrode formed on the heaters.

The phase change memory device further comprises an N+ base area formed in a surface of the silicon substrate in the cell region.

The cell switching elements comprise vertical PN diodes having a structure in which an N-type silicon layer and a P-type silicon layer are stacked.

The N-type silicon layer has a doping concentration of $1\times10^{18}\sim1\times10^{20}$ ions/cm$^3$.

The P-type silicon layer has a doping concentration of $1\times10^{20} \sim 1\times10^{22}$ ions/cm$^3$.

The heat sinks are formed using any one of W, Al, Cu and WSi.

The heaters are formed of any one of TiW, TiN, TiAlN, and WN.

The spacers comprise a single layer or a double layer including at least one of an oxide layer and a nitride layer.

The cell switching elements and the first conductive layer have the same height when viewed in section.

The first conductive layer comprises polysilicon.

The second conductive layer is formed of the same material as the heat sinks.

The heat sinks and the second conductive layer have the same height when viewed in section.

The heaters and the hard mask layer have the same height when viewed in section.

The phase change memory device further comprises gate spacers formed on both sidewalls of the gate.

The phase change layer is formed of a compound containing at least one of Ge, Sb and Te.

The phase change layer is ion-implanted with at least one of oxygen, nitrogen and silicon.

The top electrodes are formed of any one of TiN, TiW, TiAlN, and WN.

In another embodiment of the present invention, a method for manufacturing a phase change memory device comprises the steps of forming a first insulation layer which has a plurality of first holes, in a cell region of a silicon substrate which has the cell region and a peripheral region; forming cell switching elements in the first holes; removing a portion of the first insulation layer which is formed in the peripheral region of the silicon substrate; sequentially forming a gate insulation layer and a first conductive layer in the peripheral region of the silicon substrate in such a way as to have the same height as the first insulation layer of the cell region when viewed in section; sequentially forming a second conductive layer and a hard mask layer on the first insulation layer and the cell switching elements in the cell region and on the first conductive layer in the peripheral region; forming a gate in the peripheral region of the silicon substrate by etching the hard mask layer, the second conductive layer, the first conductive layer and the gate insulation layer which are formed in the peripheral region; forming heat sinks comprising the second conductive layer on the cell switching elements by etching the hard mask layer and the second conductive layer which remain in the cell region; forming a second insulation layer on the first insulation layer in the cell region and on the silicon substrate in the peripheral region such that the hard mask layer in the cell region and in the peripheral region is exposed; removing the hard mask layer exposed in the cell region such that second holes are defined to expose the heat sinks; forming spacers on sidewalls of the second holes; forming heaters in such a way as to fill the second holes in which the spacers are formed; and forming stack patterns of a phase change layer and a top electrode on the second insulation layer including the heaters.

Before the step of forming the first insulation layer, the method further comprises the step of forming an N+ base area in a surface of the silicon substrate in the cell region.

The cell switching elements comprise vertical PN diodes.

The step of forming the cell switching elements comprises the steps of forming an N-type silicon layer in the first holes; and forming a P-type silicon layer by ion-implanting P-type impurities in an upper portion of the N-type silicon layer.

The step of forming the N-type silicon layer is implemented through a selective epitaxial growth process.

The N-type silicon layer is formed by doping P or As ions to a concentration of $1\times10^{18} \sim 1\times10^{20}$ ions/cm$^3$.

The P-type silicon layer is formed by doping B or BF$_2$ ions to a concentration of $1\times10^{20} \sim 1\times10^{22}$ ions/cm$^3$.

The first conductive layer comprises polysilicon.

The second conductive layer as a material of the heat sinks is formed of any one of W, Al, Cu and WSi.

After the step of forming the gate and before the step of forming the heat sinks, the method further comprises the step of forming gate spacers on both sidewalls of the gate.

The spacers comprise a single layer or a double layer including at least one of an oxide layer and a nitride layer.

The heaters are formed of any one of TiW, TiN, TiAlN, and WN.

The phase change layer is formed of a compound containing at least one of Ge, Sb and Te.

The phase change layer is formed by ion-implanting at least one of oxygen, nitrogen and silicon.

The top electrodes are formed of any one of TiN, TiW, TiAlN, and WN.

DESCRIPTION OF SPECIFIC EMBODIMENTS

Hereafter, specific embodiments of the present invention will be described in detail with reference to the accompanying drawings.

Figure 1:
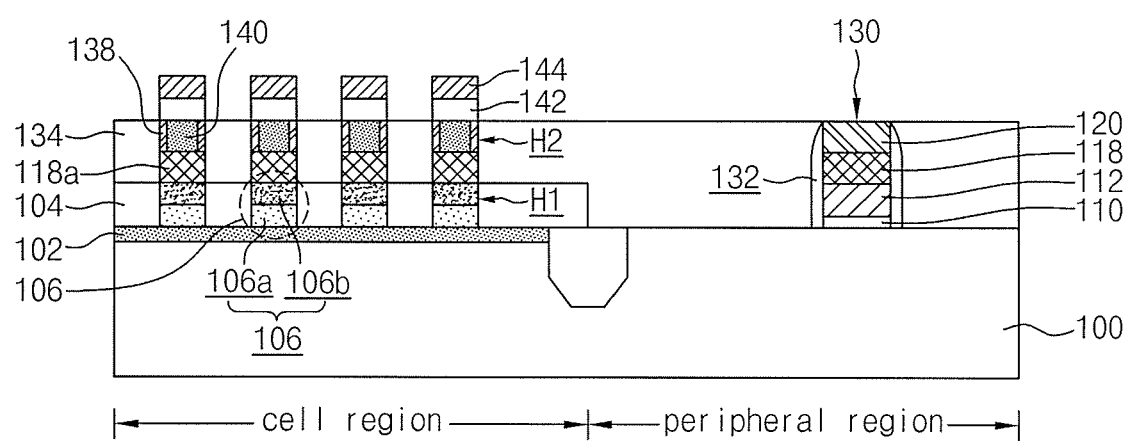
FIG. 1 is a sectional view showing a phase change memory device in accordance with a first embodiment of the present invention.

FIG. 1 is a sectional view showing a phase change memory device in accordance with a first embodiment of the present invention.

Referring to FIG. 1, a silicon substrate 100 is prepared having a cell region and a peripheral region defined therein. An N+ base area 102 is formed in the surface of the cell region of the silicon substrate 100. The N+ base area 102 is formed to electrically connect vertical PN diodes 106 serving as cell switching elements with word lines (not shown). A first insulation layer 104 is formed in the cell region of the silicon substrate 100 on the N+ base area 102. A plurality of first holes H1 are defined in the first insulation layer 104 corresponding to respective cell areas and expose the N+ base area 102. The vertical PN diodes 106 are then formed in the respective first holes H1 as cell switching elements.

Each vertical PN diode 106 comprises the stack structure of an N-type silicon layer 106a and a P-type silicon layer 106b. The N-type silicon layer 106a has a doping concentration of $1\times10^{18} \sim 1\times10^{20}$ ions/cm$^3$, and the P-type silicon layer 106b has a doping concentration of $1\times10^{20} \sim 1\times10^{22}$ ions/cm$^3$.

A gate 130 is formed in the peripheral region of the silicon substrate 100. The gate 130 comprises the stack structure of a gate insulation layer 110, a first conductive layer 112, a second conductive layer 118, and a hard mask layer 120. The first conductive layer 112 is formed of, for example, polysilicon. The combined height of the first conductive layer 112 and the gate insulation layer 110 has the same cross-sectional height as the vertical PN diodes 106 serving as cell switching elements. The second conductive layer 118 is formed of, for example, any one of W, Al, Cu and WSi, and the hard mask layer 120 comprises, for example, a nitride layer. Gate spacers 132 are formed on both sidewalls of the gate 130. The gate spacers 132 are formed to prevent the second conductive layer 118 from reacting with oxygen and oxidizing.

Heat sinks 118a are formed on the respective vertical PN diodes 106 in the cell region. The heat sinks 118a are formed of the same material as the second conductive layer 118 of the gate 130, for example, any one of W, Al, Cu and WSi. The cross-sectional height of the heat sinks 118a have the same height as the second conductive layer 118 of the gate 130 formed in the peripheral region.

A second insulation layer 134 is formed over the entire surface of the silicon substrate 100 including the cell region in which the heat sinks 118a are formed and the peripheral region in which the gate 130 is formed. The second insulation layer 134 is formed to expose the hard mask layer 120 of the gate 130 in the peripheral region. The second insulation layer 134 has second holes H2 formed therein that expose the respective heat sinks 118a in the cell region.

Spacers 138 are formed on the sidewalls of the second holes H2 of the second insulation layer 134. Heaters 140 are then formed to fill the second holes H2 having the spacers 138 formed on the sidewalls thereof. Accordingly, the heaters 140 are formed on the center portions of the heat sinks 118a and the spacers 138 are formed on the peripheral portions of the heat sinks 118a to surround the heaters 140. The heaters 140 are formed of any one of TiW, TiN, TiAlN, and WN. The height of the formed heaters 140 have the same height as the hard mask layer 120 of the gate 130. The spacers 138 comprise a single layer of a nitride layer or an oxide layer.

The stack patterns of a phase change layer 142 and a top electrode 144 are formed on the second insulation layer 134 including the heaters 140. The stack patterns of the phase change layer 142 and the top electrode 144 are formed, for example, as lines that extend in a direction perpendicular to the direction of the N+ base area 102.

While not shown in a drawing, a third insulation layer is formed on the second insulation layer 134 including the stack patterns of the phase change layer 142 and the top electrode 144. Bit lines (not shown) are formed on the third insulation layer in such a way as to be connected with top electrodes 144 through top electrode contacts. A fourth insulation layer (not shown) is formed on the third insulation layer in such a way as to cover the bit lines. Word lines (not shown) are formed on the fourth insulation layer to be electrically connected with the N+ base area 102 through contacts and to extend in a direction perpendicular to the bit lines.

As is apparent from the above description, in the phase change memory device according to the present invention, the heaters can be uniformly formed since heaters are formed in second holes defined in a second insulation layer in a self-aligned manner and the size of the heaters is decreased by the presence of spacers. More specifically, as the contact area between the heaters and the phase change layer can be decreased, the programming current can be reduced.

Further, in the phase change memory device according to the present invention, heat transfer to the heaters can quickly occur when the phase change layer is quenched by the heat sinks because heat sinks are formed under the heaters. Accordingly, the amorphous phase of the phase change layer can be stably formed. As a result, in the phase change memory device according to the present invention, the difference between the reset resistance of the amorphous phase and the set resistance of a crystalline state can be increased, whereby a sensing margin can be increased.

FIGS. 2A through 2L are sectional views showing the processes for a method of manufacturing the phase change memory device in accordance with the first embodiment of the present invention. The method will be described below.

Figure 2A:
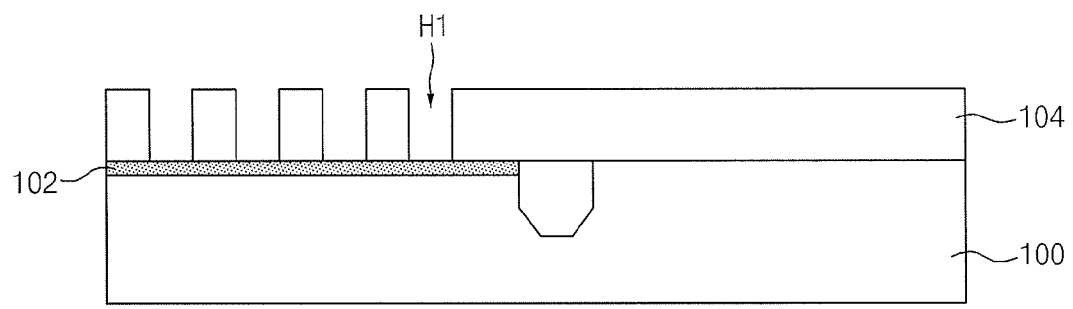
FIGS. 2A through 2L are sectional views showing the processes for a method of manufacturing the phase change memory device in accordance with the first embodiment of the present invention.

Referring to FIG. 2A, a silicon substrate 100 is prepared having a cell region and a peripheral region defined therein. After delimiting active areas in the respective regions of the silicon substrate 100, i.e., the cell region and the peripheral region, an N+ base area 102 is formed in the cell region by ion-implanting N-type impurities into the surface of the active area in the cell region. A first insulation layer 104 is formed on the overall surface of the silicon substrate 100 including the N+ base area 102. A plurality of first holes H1 are then defined in portions of the first insulation layer 104 corresponding to the cell region by etching the first insulation layer 104.

Figure 2B:
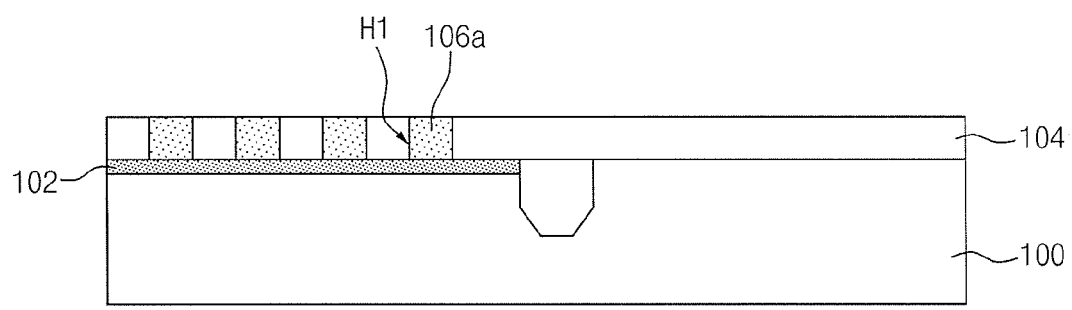

Referring to FIG. 2B, an N-type silicon layer 106a is grown in the first holes H1 through an SEG (selective epitaxial growth) process. During this process, the N-type silicon layer 106a may grow to a height exceeding that of the first insulation layer 104. The portion of the N-type silicon layer 106a that grows beyond the height of the first insulation layer 104 is removed through a CMP (chemical mechanical polishing) process so as to make uniform the height of both the insulation layer 104 and the N-type silicon layer 106a. The N-type silicon layer 106a is formed by ion-implanting P or As ions to a concentration of $1 \times 10^{18} \sim 1 \times 10^{20}$ ions/cm$^3$. The N-type silicon layer 106a functions to lessen the electric field between the N+ base area 102 and a P-type silicon layer which will be subsequently formed.

Figure 2C:
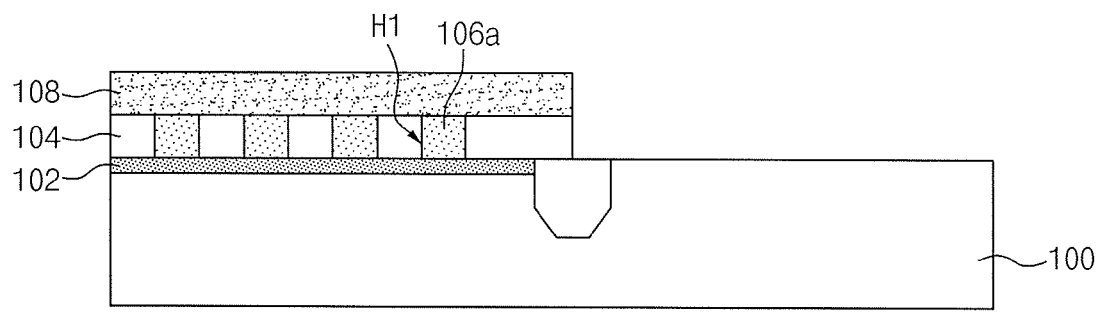

Referring to FIG. 2C, a first mask pattern 108 is formed to cover a portion of the first insulation layer 104 corresponding to the cell region including the N-type silicon layer 106a. The first insulation layer 104 formed in the peripheral region is removed by conducting an etching process using the first mask pattern 108 as an etch mask. The first mask pattern 108 is formed, for example, through applying, lithographing and developing a photoresist layer.

Figure 2D:
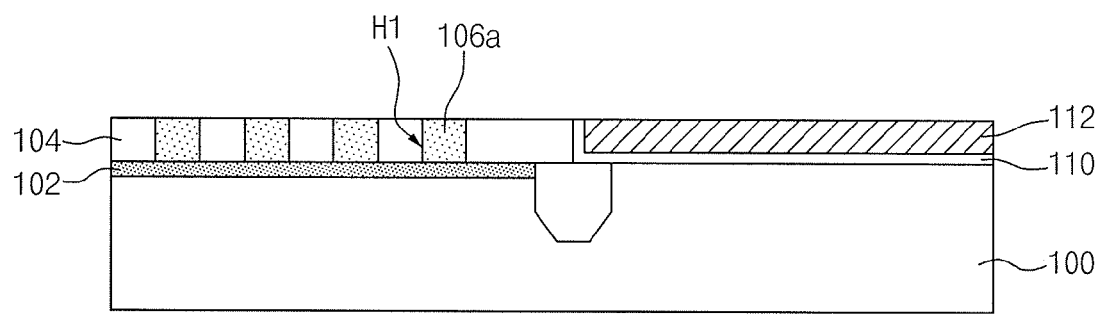

Referring to FIG. 2D, the first mask pattern 108 is removed through a process well known in the art. A gate insulation layer 110 and a first conductive layer 112 are sequentially formed on the overall surface of the resultant silicon substrate 100. The portions of the gate insulation layer 110 and the first conductive layer 112 formed on the first insulation layer 104 and the N-type silicon layer 106a of the cell region, are removed through a CMP process. As a result, the height of the first insulation 104, the N-type silicon layer 106a, and the combination of gate insulation layer 110 and the first conductive layer 112 are the same. The gate insulation layer 110 comprises, for example, an oxide layer, and the first conductive layer 112 comprises, for example, a polysilicon layer.

Figure 2E:
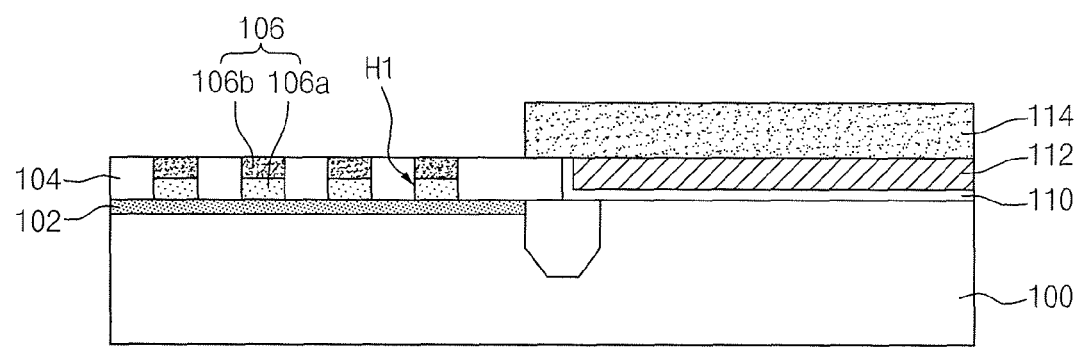

Referring to FIG. 2E, a second mask pattern 114 is formed to cover the peripheral region of the silicon substrate 100. The second mask pattern 114 is formed, for example, through applying, lithographing and developing a photoresist layer. A P-type silicon layer 106b is formed in the upper portion of the N-type silicon layer 106a by ion-implanting P-type impurities into the N-type silicon layer 106a. The N-type silicon layer 106a is exposed in the cell region using the second mask pattern 114 as an ion implantation mask. Using this process, vertical PN diodes 106 are formed comprising the stack structure of the N-type silicon layer 106a and the P-type silicon layer 106b in the first holes H1 in the cell region as cell switching elements. The P-type silicon layer 106b is formed by ion-implanting B or BF$_2$ ions as P-type impurities to a concentration of $1 \times 10^{20} \sim 1 \times 10^{22}$ ions/cm$^3$.

Accordingly, when viewed as a cross-section, the vertical PN diodes 106 formed in the cell region have the same height as the combined height of second conductive layer 112 and the gate insulation layer 110 that are formed in the peripheral region.

Figure 2F:
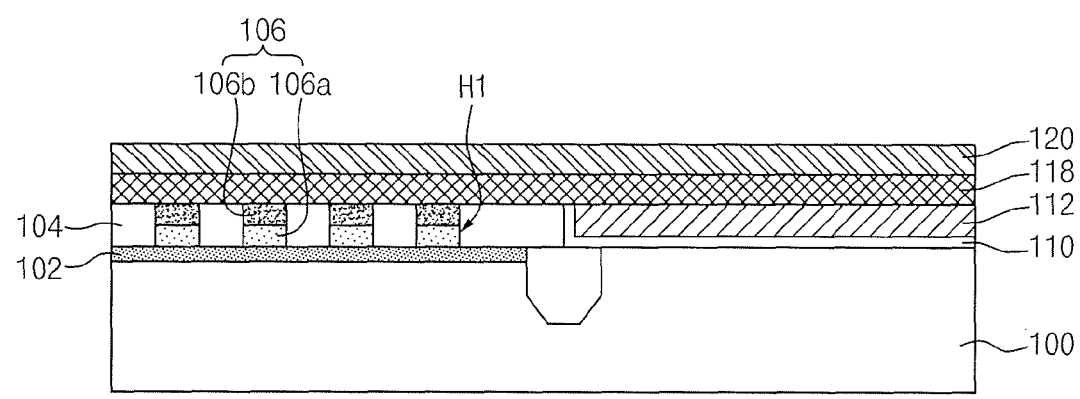

Referring to FIG. 2F, the second mask pattern 114 is removed through a process well known in the art. A second conductive layer 118 and a hard mask layer 120 are sequentially formed on the first insulation layer 104 including the vertical PN diodes 106 in the cell region and on the first conductive layer 112 and the gate insulation layer 110 in the peripheral region. The second conductive layer 118 is formed as a metal-based layer, for example, using any one of W, Al, Cu and WSi, and the hard mask layer 120 comprises, for example, a nitride layer.

Figure 2G:
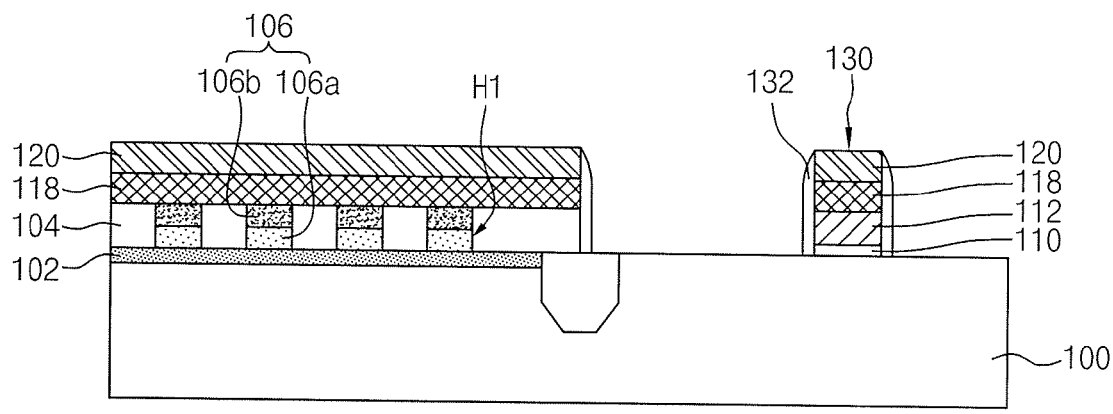

Referring to FIG. 2G, a gate 130 comprising the stack structure of the gate insulation layer 110, the first conductive layer 112, the second conductive layer 118 and the hard mask layer 120 is formed in the peripheral region by etching in the peripheral region the hard mask layer 120, the second conductive layer 118, the first conductive layer 112 and the gate insulation layer 110. Gate spacers 132, which comprise a single layer or a multiple layer including at least one of an oxide layer and a nitride layer, are formed on both sidewalls of the gate 130 through a process well known in the art.

Figure 2H:
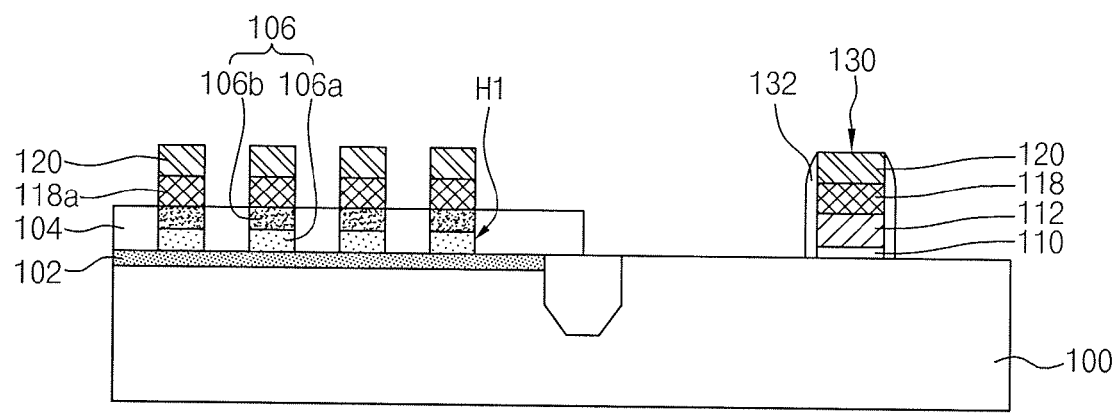

Referring to FIG. 2H, heat sinks 118a comprising the second conductive layer 118 are formed on the vertical PN diodes 106 in the cell region by etching the hard mask layer 120 and the second conductive layer 118 which remain in the cell region. As can be readily seen from the above description, the heat sinks 118a are formed as a metal-based layer, e.g., using any one of W, Al, Cu and WSi as the material of the second conductive layer 118. In a completely manufactured phase change memory device, the heat sinks 118a allow the heat generated in a melted phase change layer to be quickly transferred to heater areas.

As described above, the heat sinks 118a of the cell region and the second conductive layer 118 of the peripheral region are formed of the same level layer. In particular, when viewed as a cross-section, the heat sinks 118a and the second conductive layer 118 have the same height.

Figure 2I:
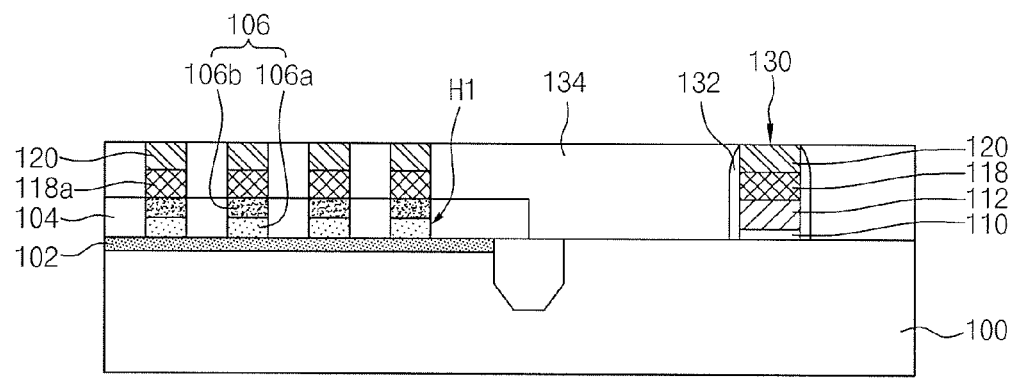

Referring to FIG. 2I, a second insulation layer 134 is formed on the overall surface of the resultant silicon substrate 100 having the heat sinks 118a and the gate 130 formed thereon. The second insulation layer 134 is then polished through a CMP process until the hard mask layer 120 which remains on the heat sinks 118a in the cell region and the hard mask layer 120 of the gate 130 which is formed in the peripheral region are exposed. That is, after the CMP process a planar resulting surface is formed.

Figure 2J:
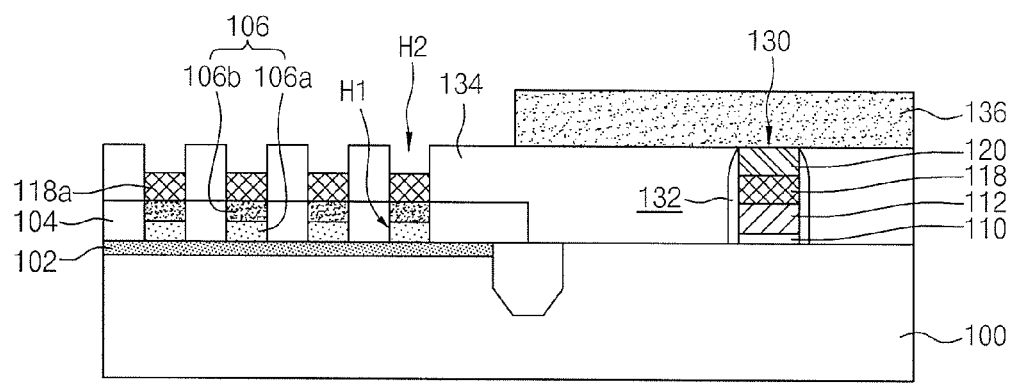

Referring to FIG. 2J, a third mask pattern 136 is formed on the second insulation layer 134 and the gate 130 to cover the peripheral region. The third mask pattern 136 is formed, for example, through applying, lithographing and developing a photoresist layer. The hard mask layer 120 exposed in the cell region, which is not covered by the third mask pattern 136, is then removed. As a result, second holes H2 are defined to expose the heat sinks 118a.

Figure 2K:
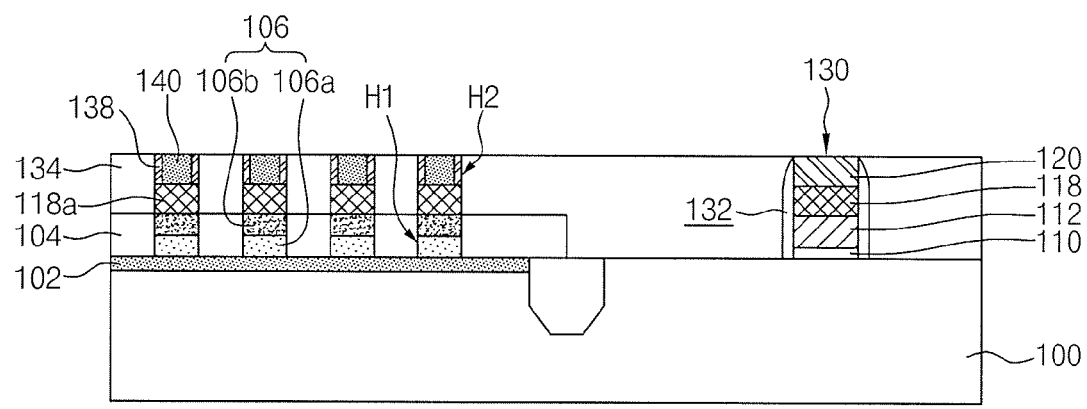

Referring to FIG. 2K, the third mask pattern 136 is removed through a process well known in the art and a nitride layer is formed on the second insulation layer 134 including the surfaces of the second holes H2. The nitride layer is deposited to such a thickness so as to not completely fill the second holes H2. That is, the nitride layer is deposited so as to form a thin layer. By further etching back the nitride layer formed on the second insulation layer 134, spacers 138 are formed on both sidewalls of the second holes H2. The spacers 138 are formed on the peripheral portions of the heat sinks 118a. That is, the spacers 138 are formed along the outer sidewalls of the second holes H2.

A heater material is formed on the resultant silicon substrate 100 in such a way as to completely fill the remaining opening in second holes H2 in which the spacers 138 are formed. As the heater material, e.g., any one of TiW, TiN, TiAlN, and WN is used, which have excellent heat conductivity and low reactivity with a phase change layer to be subsequently formed. The heater material which is formed above the upper ends of the second holes H2 is removed. Accordingly, the heaters 140 are formed to fill the second holes H2 in which the spacers 138 are formed. As a result, the heaters 140 can be uniformly formed and the contact area between the heaters 140 and the phase change layer to be subsequently formed can be decreased because the heaters 140 are formed in a self-aligned manner and the size of the heaters 140 is decreased due to the presence of the spacers 138. Accordingly, the programming current can be reduced.

Figure 2L:
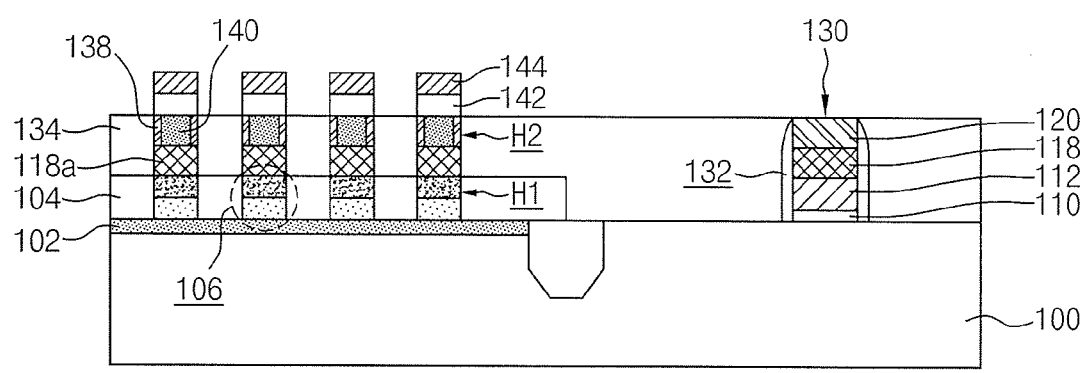

Referring to FIG. 2L, a phase change material layer and a conductive layer for top electrodes are sequentially formed on the second insulation layer 134 including the heaters 140. Patterning the phase change material layer 142 and the conductive layer for top electrodes forms the stack pattern of a phase change layer 142 and a top electrode 144. The stack patterns of the phase change layer 142 and the top electrode 144 are formed in lines that extend in a direction perpendicular to the direction of the N+ base area 102. The phase change layer 142 is formed of a compound containing at least one of Ge, Sb and Te as Chalcogenide materials. The phase change layer 142 is formed by ion-implanting at least one of oxygen, nitrogen and silicon to the compound as impurities. The top electrodes 144 are formed of any one of TiN, TiW, TiAlN, and WN.

Next, while not shown in a drawing, a third insulation layer is formed to cover the stack patterns of the phase change layer 142 and the top electrode 144. Bit lines (not shown) are then formed on the third insulation layer connected with the top electrodes 144 through top electrode contacts. The bit lines are formed to extend in a direction parallel to the stack patterns of the phase change layer 142 and the top electrode 144. A fourth insulation layer (not shown) is subsequently formed to cover the bit lines and word lines (not shown) are formed on the fourth insulation layer and are electrically connected with the N+ base area 102 of the cell region. The word lines are formed to extend in a direction perpendicular to the bit lines. Thereafter, the manufacture of the phase change memory device in accordance with the first embodiment of the present invention is completed by sequentially conducting a series of well-known subsequent processes.

As is apparent from the above description, according to an embodiment of the present invention, heat transfer from a phase change layer to the heaters can quickly occur since heat sinks are formed under the heaters. Accordingly, a reset state of high resistance can be produced because the phase change layer can stably form an amorphous phase. As a result, the difference between the reset resistance and the set resistance can become substantial enough so that a sensing margin can be increased.

Also, in the present invention, the heaters can be uniformly formed due to the fact that the heaters are formed in a self-aligned manner and the size of the heaters is decreased due to the presence of spacers. Further, programming current can be reduced because the contact area between the heaters and the phase change layer can be decreased.

Figure 3:
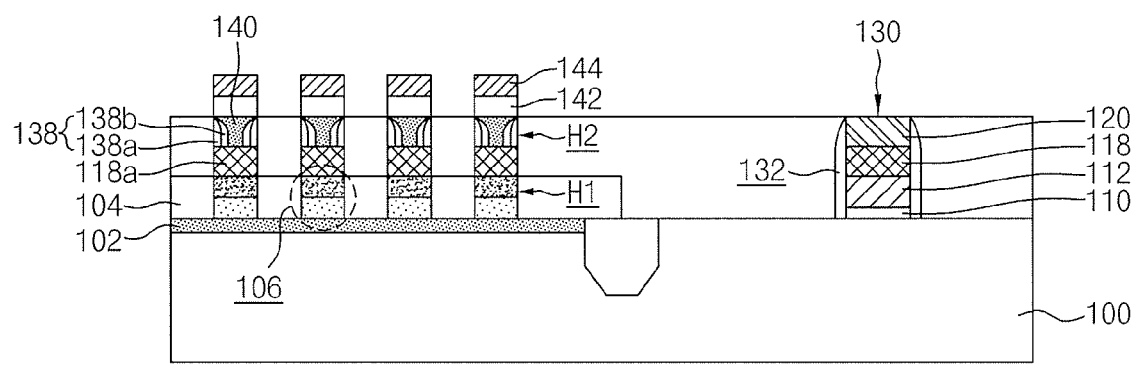
FIG. 3 is a sectional view showing a phase change memory device in accordance with a second embodiment of the present invention.

In the aforementioned embodiment of the present invention, the spacers, which are formed to decrease the size of the heaters, comprise a single layer of an oxide layer or a nitride layer. However, as shown in FIG. 3, spacers 138 may be formed of different materials. For example, the spacers 138 can comprise a double layer of an oxide layer and a nitride layer.

Further, while not shown in a drawing, it can be envisaged that the spacers can comprise multiple layers of an oxide layer and a nitride layer.

In FIG. 3, the reference numeral 138a designates nitride layer spacers and 138b designates oxide layer spacers. The other component elements in FIG. 3 except the spacers 138 comprising the double-layered structure are the same as those of the aforementioned embodiment and therefore will not be described any further.

Although specific embodiments of the present invention have been described for illustrative purposes, those skilled in the art will appreciate that various modifications, additions and substitutions are possible, without departing from the scope and the spirit of the invention as disclosed in the accompanying claims.

What is claimed is:

1. A phase change memory device comprising:
a silicon substrate having a cell region and a peripheral region;
a first insulation layer formed on the silicon substrate in the cell region of the silicon substrate and having a plurality of holes;
cell switching elements formed in the holes of the first insulation layer; heat sinks formed on the cell switching elements; heaters, one of which is formed on a center portion of each of the heat sink; spacers formed on the heat sinks to surround the heaters; a gate formed in the peripheral region of the silicon substrate and comprising a stack structure including a gate insulation layer, a first conductive layer, a second conductive layer, and a hard mask layer;
a second insulation layer formed on the peripheral and cell regions of the silicon substrate which is formed with the spacers, the heaters, the heat sinks and the gate, wherein the second insulation layer is formed to expose the spacers and the heaters of the cell region and the hard mask layer of the peripheral region; and
stack patterns of a phase change layer and a top electrode formed on the heaters,
wherein the cell switching elements comprise vertical PN diodes having a stack structure comprising an N-type silicon layer and a P-type silicon layer.

2. The phase change memory device according to claim 1, further comprising:
an N+ base area formed in a surface of the silicon substrate in the cell region.

3. The phase change memory device according to claim 1, wherein the N-type silicon layer has a doping concentration of $1 \times 10^{18} \sim 1 \times 10^{20}$ ions/cm$^3$.

4. The phase change memory device according to claim 1, wherein the P-type silicon layer has a doping concentration of $1 \times 10^{20} \sim 1 \times 10^{22}$ ions/cm$^3$.

5. The phase change memory device according to claim 1, wherein the heat sinks are formed using any one of W, Al, Cu and WSi.

6. The phase change memory device according to claim 1, wherein the heaters are formed of any one of TiW, TiN, TiAlN, and WN.

7. The phase change memory device according to claim 1, wherein the spacers comprise a single layer or a double layer including at least one of an oxide layer and a nitride layer.

8. The phase change memory device according to claim 1, wherein a cross-sectional height of the cell switching elements and a combined cross-sectional height of the first conductive layer and the gate insulation layer are the same.

9. The phase change memory device according to claim 1, wherein the first conductive layer comprises polysilicon.

10. The phase change memory device according to claim 1, wherein the second conductive layer is formed of a same material as the heat sinks.

11. The phase change memory device according to claim 1, wherein the heat sinks and the second conductive layer have the same cross-sectional height.

12. The phase change memory device according to claim 1, wherein the heaters and the hard mask layer have the same cross-sectional height.

13. The phase change memory device according to claim 1, further comprising: gate spacers formed on both sidewalls of the gate.

14. The phase change memory device according to claim 1, wherein the phase change layer is formed of a compound containing at least one of Ge, Sb and Te.

15. The phase change memory device according to claim 14, wherein the phase change layer is ion-implanted with at least one of oxygen, nitrogen, and silicon.

16. The phase change memory device according to claim 1, wherein the top electrodes are formed of any one of TiN, TiW, TiAlN, and WN.

* * * * *